United States Patent
Allen et al.

(10) Patent No.: US 7,399,581 B2
(45) Date of Patent: Jul. 15, 2008

(54) PHOTORESIST TOPCOAT FOR A PHOTOLITHOGRAPHIC PROCESS

(75) Inventors: Robert David Allen, San Jose, CA (US); Ratnam Sooriyakumaran, San Jose, CA (US); Linda Karin Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 11/064,871

(22) Filed: Feb. 24, 2005

(65) Prior Publication Data

US 2006/0189779 A1 Aug. 24, 2006

(51) Int. Cl.
*G03F 7/20* (2006.01)
*G03F 7/30* (2006.01)
*G03F 7/09* (2006.01)
*G03F 7/11* (2006.01)

(52) U.S. Cl. ............ 430/325; 430/326; 430/272.1; 430/273.1; 430/330; 430/331

(58) Field of Classification Search ............ None
See application file for complete search history.

(56) References Cited

U.S. PATENT DOCUMENTS

| | | | |
|---|---|---|---|
| 6,632,582 B2 | 10/2003 | Kishimura et al. | 430/270.1 |
| 6,783,917 B2 | 8/2004 | Blakeney et al. | 430/270.1 |
| 6,936,663 B1 * | 8/2005 | Modisette | 525/476 |
| 2002/0090572 A1 | 7/2002 | Sooriyakumaran et al. | 430/271.1 |
| 2002/0127416 A1 | 9/2002 | Hacker | 428/447 |
| 2002/0136910 A1 | 9/2002 | Hacker | 428/450 |
| 2003/0087172 A1 | 5/2003 | Zhu et al. | 430/66 |
| 2003/0108812 A1 | 6/2003 | Rottstegge et al. | 430/270.1 |
| 2003/0120099 A1 | 6/2003 | Laine et al. | 556/450 |
| 2004/0033371 A1 | 2/2004 | Hacker | 428/447 |
| 2004/0121251 A1 | 6/2004 | Yokota et al. | 430/58.45 |
| 2004/0137362 A1 | 7/2004 | De et al. | 430/270.1 |
| 2004/0161698 A1 | 8/2004 | Kanagasabapathy et al. | 430/270.1 |
| 2004/0180299 A1 | 9/2004 | Rolland et al. | 430/322 |
| 2006/0093959 A1 * | 5/2006 | Huang et al. | 430/270.1 |
| 2006/0110677 A1 * | 5/2006 | Houlihan et al. | 430/270.1 |

OTHER PUBLICATIONS

Linda Geppert, Chip Making's Wet New World, IEEE Spectrum May 2004, pp. 30-33.

* cited by examiner

*Primary Examiner*—Sin J. Lee
(74) *Attorney, Agent, or Firm*—Schmeiser, Olson & Watts

(57) ABSTRACT

A composition that includes functionalized polyhedral oligomeric silsesquioxanes derivatives of the formulas $T_m^{R3}$ where m is equal to 8, 10 or 12 and $Q_n M_n^{R1,R2,R3}$ where n is equal to 8, 10 or 12 are provided. The functional groups include aqueous base soluble moieties. Mixtures of the functionalized polyhedral oligomeric silsesquioxanes derivatives are highly suitable as a topcoat for photoresist in photolithography and immersion photolithography applications.

14 Claims, 5 Drawing Sheets

PHOTORESIST TOPCOAT FOR A PHOTOLITHOGRAPHIC PROCESS

FIELD OF THE INVENTION

The present invention relates to the fields of non-polymer chemistry, photolithography and semiconductor fabrication; more specifically, it relates to an composition of a non-polymeric, silicon-containing material, a topcoat non-polymeric, silicon containing composition and a method of forming a photolithographic image using the topcoat.

BACKGROUND OF THE INVENTION

As the size of structures of advanced integrated circuits has decreased, manufacturers are turning to a micro-lithography technique called immersion lithography, because of its improved resolution capability. In immersion lithography, an immersion fluid is placed between the optical lens and a photoresist layer. The immersion fluid provides considerably higher resolution than conventional photoirradiation in air. However, in many photoresist systems, components of the photoresist leach out into the immersion fluid and/or the immersion fluid penetrates into the photoresist thus degrading performance. Therefore, there is a need for a method to prevent interaction between photoresist layers and immersion fluid in an immersion lithography system.

SUMMARY OF THE INVENTION

The method to prevent interaction between photoresist layers and immersion fluid in an immersion lithography system of the present invention is to apply a topcoat over a photoresist layer so the topcoat separates the photoresist layer from the immersion fluid during exposure. Topcoat compositions of the present invention are based on Polyhedral Oligomeric Silsesquioxanes derivatives that have the desired attributes of being non-soluble in water (as many immersion fluids comprise water), readily soluble in photoresist developer (particularly basic developers), soluble in a casting solvent, not interacting with photoresist (no dissolution, swelling of the photoresist due to intermixing), and low absorption at photoresist exposure wavelengths.

Further, the topcoat compositions of the present invention inhibit leaching of photoresist components into the immersion fluid. Additionally, the topcoat compositions of the present invention are non-polymeric in nature.

A first aspect of the present invention is a resin composition, comprising: a $Q_n M_n^{R1,R2,R3}$ resin, wherein Q represents $SiO_{4/2}$, $M^{R1,R2,R3}$ represents $R^1,R^2,R^3$ $SiO_{1/2}$, and n is equal to 8, 10 or 12; wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; and wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein $Y^1$ and $Y^2$ cannot both be hydrogen, and wherein $Y^3$ is selected from the group consisting of —CONHCO— and —CONOHCO—, each monovalent bond of the $Y^3$ group bonded to different adjacent carbon atoms of the $R^3$.

A second aspect of the present invention is a resin composition, comprising: a $T_m^{R3}$ resin, wherein T represents $R^3$ $SiO_{3/2}$, and m is equal to 8, 10 or 12; wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms, a cycloalkyl substituted alkyl group having 4-23 carbon atoms and an alkyl substituted cycloalkyl group having 4-23 carbon atoms; and wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein $Y^1$ and $Y^2$ cannot both be hydrogen, and wherein $Y^3$ is selected from the group consisting of —CONHCO— and —CONOHCO—, each monovalent bond of the $Y^3$ group bonded to different adjacent carbon atoms of the $R^3$.

A third aspect of the present invention is a topcoat composition, comprising: a mixture of two or more resins, each resin of the mixture of two or more resins comprising different $Q_n M_n^{R1,R2,R3}$ resins, wherein Q represents $SiO_{4/2}$, $M^{R1,R2,R3}$ represents $R^1,R^2,R^3$ $SiO_{1/2}$, and n is equal to 8, 10 or 12; wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; and wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein $Y^1$ and $Y^2$ cannot both be hydrogen, and wherein $Y^3$ is selected from the group consisting of —CONHCO— and —CONOHCO—, each monovalent bond of the $Y^3$ group bonded to different adjacent carbon atoms of the $R^3$; and a casting solvent selected from the group consisting of linear monohydroxyl alcohols having 4-10 carbon atoms, branched chain monohydroxyl alcohols having 4-10 carbon atoms, cyclic monohydroxyl alcohols having 4-10 carbon atoms, linear dihydroxyl alcohols having 4-10 carbon atoms, branched chain dihydroxyl alcohols having 4-10 carbon atoms, cyclic dihydroxyl alcohols having 4-10 carbon atoms, and combinations thereof.

A fourth aspect of the present invention is a topcoat composition, comprising a mixture of two or more resins, each resin of the mixture of two or more resins comprising different $T_m^{R3}$ resins, wherein T represents $R^3$ $SiO_{3/2}$, and m is equal to 8, 10 or 12; wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; and wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein $Y^1$ and $Y^2$ cannot both be hydrogen, and wherein $Y^3$ is selected from the group consisting of —CONHCO— and —CONOHCO—, each monovalent bond of the $Y^3$ group bonded to different adjacent carbon atoms of the $R^3$; and a casting solvent selected from the group consisting of linear monohydroxyl alcohols having 4-10 carbon atoms, branched chain monohydroxyl alcohols having 4-10 carbon atoms, cyclic monohydroxyl alcohols having 4-10 carbon atoms, linear dihydroxyl alcohols having 4-10 carbon atoms, branched chain dihydroxyl alcohols having 4-10 carbon atoms, cyclic dihydroxyl alcohols having 4-10 carbon atoms, and combinations thereof.

A fifth aspect of the present invention is a topcoat composition, comprising: a mixture of two or more different resins, wherein each resin of the mixture of two or more different resins is selected from the group consisting of $Q_nM_n^{R1,R2,R3}$ resins and $T_m^{R3}$ resins, wherein Q represents SiO$_{4/2}$, $M^{R1,R2,R3}$ represents $R^1,R^2,R^3$ SiO$_{1/2}$, n is equal to 8, 10 or 12, T represents $R^3$ SiO$_{3/2}$, and m is equal to 8, 10 or 12, wherein a first resin of the mixture of two or more different resins is a $Q^nM_n^{R1,R2,R3}$ resin and a second resin of the mixture of two or more different resins is a $T_m^{R3}$; wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; and wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein $Y^1$ and $Y^2$ cannot both be hydrogen, and wherein $Y^3$ is selected from the group consisting of —CONHCO— and —CONOHCO—, each monovalent bond of the $Y^3$ group bonded to different adjacent carbon atoms of the $R^3$; and a casting solvent selected from the group consisting of linear monohydroxyl alcohols having 4-10 carbon atoms, branched chain monohydroxyl alcohols having 4-10 carbon atoms, cyclic monohydroxyl alcohols having 4-10 carbon atoms, linear dihydroxyl alcohols having 4-10 carbon atoms, branched chain dihydroxyl alcohols having 4-10 carbon atoms, cyclic dihydroxyl alcohols having 4-10 carbon atoms, and combinations thereof.

A sixth aspect of the present invention is a method of forming an image in a photoresist layer, comprising: (a) providing a substrate; (b) forming the photoresist layer over the substrate; (c) forming a topcoat over a top surface of the photoresist layer, wherein the topcoat layer includes at least one silicon containing material, includes no polymeric materials, or includes at least one silicon containing material and no polymeric materials; (d) exposing the photoresist to radiation through a photomask having opaque and clear regions, the opaque regions blocking the radiation and the clear regions being transparent to the radiation, the radiation changing the chemical composition of regions of the photoresist layer exposed to the radiation forming exposed and unexposed regions in the photoresist layer; and (e) removing either the exposed regions of the photoresist layer or the unexposed regions of the layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
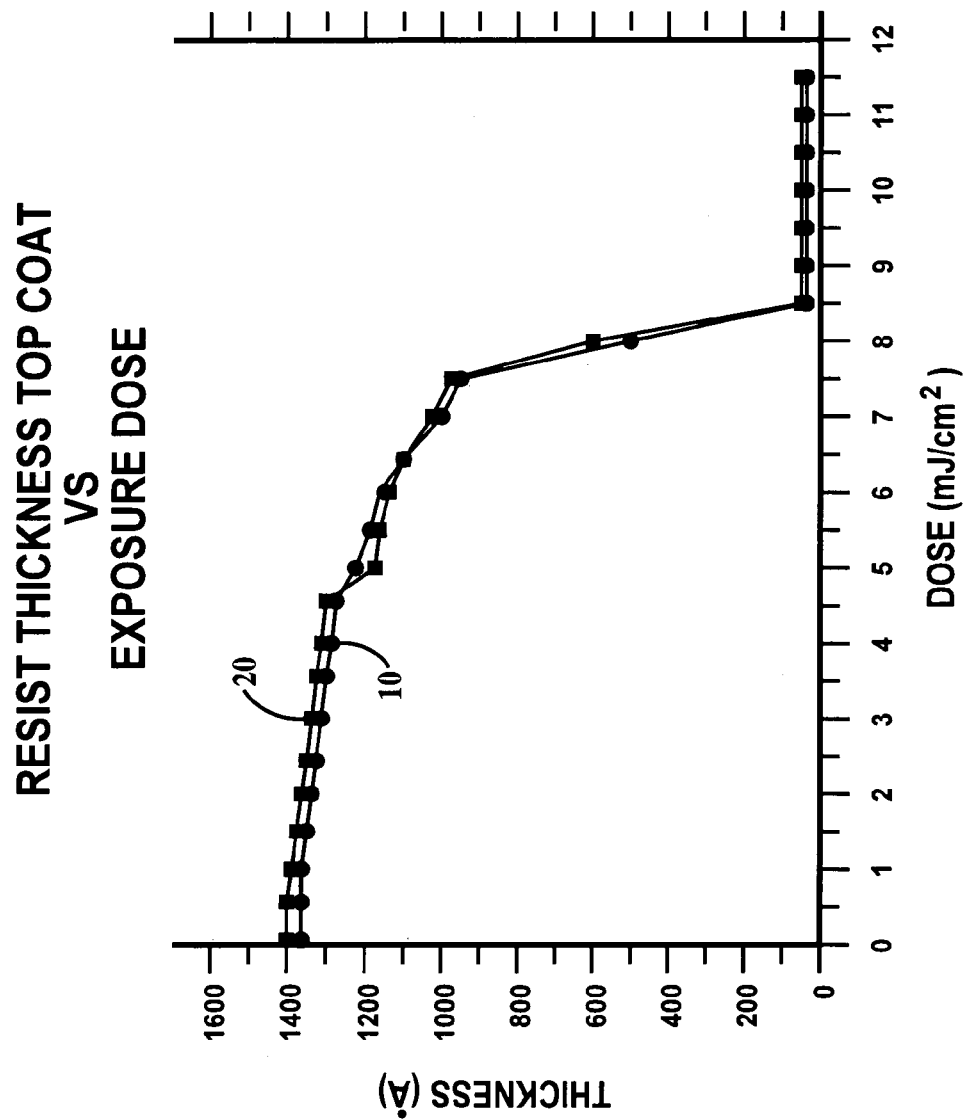
FIG. 1 is a plot of contrast curves of a photoresist layer without a topcoat layer and a photoresist layer with a topcoat comprising the product of synthesis example 1 of the present invention.

An oligomer is defined as a molecule consisting of only a few, less than about 20, repeating units. The polyhedral silsesquioxane backbones of the Polyhedral Oligomeric Silsesquioxanes (POSS) derivatives of the present invention are thus oligmers of Si and O atoms with a small number of repeating units (about 24 or less Si atoms). Furthermore, the POSS derivatives themselves are not to be considered polymers, but rather monomers as there is only one non-repeating POSS unit in a POSS derivative of the present invention.

The POSS derivatives of the present invention are resins having the structures (IA), (IB), (IIA), (IIIB), (IIIA) or (IIIB) where:

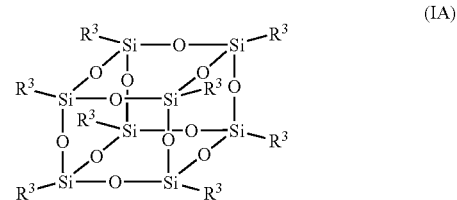

(IA)

is denoted by the formula $T_8^{R3}$, where T represents $R^3$ SiO$_{3/2}$.

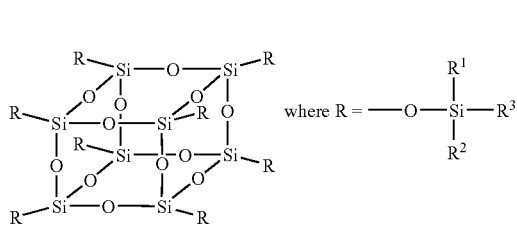 (IB)

is denoted by the formula $Q_8M_8^{R1,R2,R3}$ where Q represents $SiO_{4/2}$ and $M^{R1,R2,R3}$ represents $R^1,R^2,R^3SiO_{1/2}$;

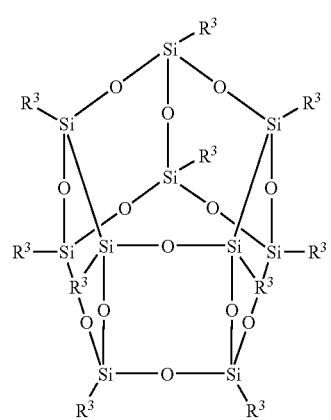 (IIA)

is denoted by the formula $T_{10}^{R3}$, where T represents $R^3SiO_{3/2}$;

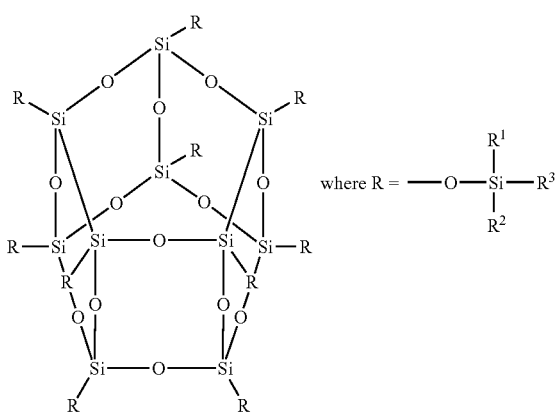 (IIB)

is denoted by the formula $Q_{10}M_{10}^{R1,R2,R3}$ where Q represents $SiO_{4/2}$ and $M^{R1,R2,R3}$ represents $R^1,R^2,R^3SiO_{1/2}$;

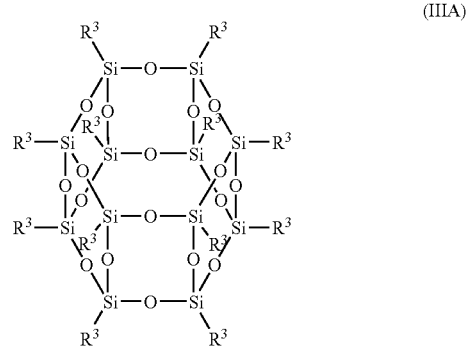 (IIIA)

is denoted by the formula $T_{12}^{R3}$, where T represents $R^3SiO_{3/2}$;

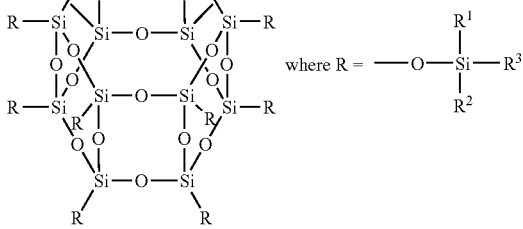 (IIIB)

is denoted by the formula $Q_{12}M_{12}^{R1,R2,R3}$ where Q represents $SiO_{4/2}$ and $M^{R1,R2,R3}$ represents $R^1,R^2,R^3SiO_{1/2}$;

wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms;

wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; and wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein Y$^1$ and Y$^2$ cannot both be hydrogen, and wherein Y$^3$ is selected from the group consisting of —CONHCO— and —CONOHCO—, each monovalent bond of the Y$^3$ group bonded to different adjacent carbon atoms of the R$^3$.

In the notation SiO$_{x/y}$, x represents the number of oxygen atoms to which each silicon atom is bonded and y represents the number of silicon atoms to which each oxygen is bonded. The POSS resins of the present invention may be denoted by the general formulas T$_m^{R3}$ where m is equal to 8, 10 or 12 and Q$_n$M$_n^{R1,R2,R3}$ where n is equal to 8, 10 or 12.

It should also be noted that the notation Q$_n$M$_n^{R1,R2,R3}$ may be written as Q$_n$M$_n^{R2,R3}$ when R$^1$ is —CH$_3$, as Q$_n$M$_n^{R1,R2,R3}$ when R$^2$ is —CH$_3$, as Q$_n$M$_n^{R3}$ when both R$^1$ and R$^2$ are —CH$_3$, as Q$_n$M$_n^{H,R2,R3}$ when R$^1$ is —H, as Q$_n$M$_n^{R1,H,R3}$ when R is —H, as Q$_n$M$_n^{H,H,R3}$ when both R$^1$ and R$^2$ are —H and as Q$_n$M$_n^{H,R3}$ when R$^1$ is —CH$_3$ and R$^2$ is H.

Synthesis of T$_m^{R3}$ and Q$_n$M$_n^{R1,R2,R3}$ Resins

Structure (IA) may be synthesized by reacting structure (IVA)

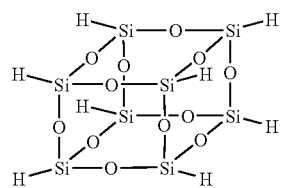
(IVA)

with a substituted alkene or cylcoalkene, the substituent group being a water soluble moiety such as a Y$^1$ group and/or a Y group or a Y$^3$ group (or a group that may be converted to a Y$^1$ group and/or a Y$^2$ group or a Y$^3$ group) in a suitable solvent and in the presence of a catalyst such as platinum(0)-1,3-divinyl-1,1,3,3 tetramethyldisiloxane complex.

Structure (IB) may be synthesized by reacting structure (IVB)

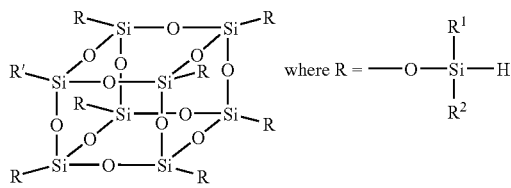
(IVB)

with a substituted alkene or cylcoalkene, the substituent group being a water soluble moiety such as a Y$^1$ group and/or a Y$^2$ group or a Y$^3$ group (or a group that may be converted to a Y$^1$ group and/or a Y$^2$ group or a Y$^3$ group) in a suitable solvent and in the presence of a catalyst such as platinum(0)-1,3-divinyl-1,1,3,3 tetramethyldisiloxane complex.

Structure (IIA) may be synthesized by reacting structure (VA)

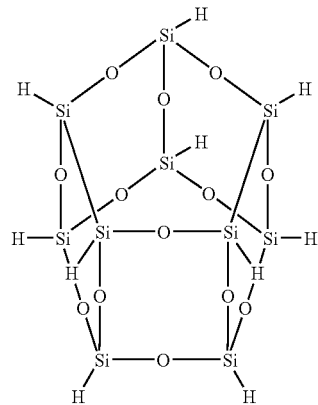
(VA)

with a substituted alkene or cylcoalkene, the substituent group being a water soluble moiety such as a Y$^1$ group and/or a Y$^2$ group or a Y$^3$ group (or a group that may be converted to a Y$^1$ group and/or a Y$^2$ group or a Y$^3$ group) in a suitable solvent and in the presence of a catalyst such as platinum(0)-1,3-divinyl-1,1,3,3 tetramethyldisiloxane complex.

Structure (IIB) may be synthesized by reacting structure (VB)

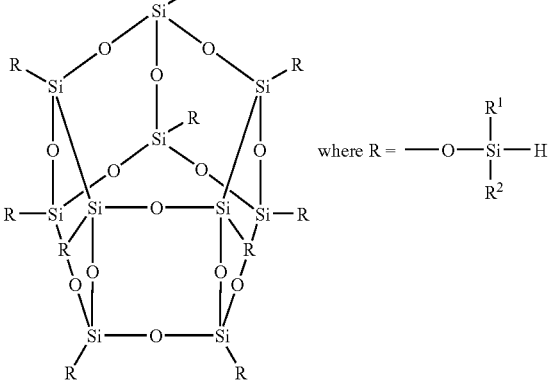
(VB)

with a substituted alkene or cylcoalkene, the substituent group being a water soluble moiety such as a Y$^1$ group and/or a Y$^2$ group or a Y$^3$ group (or a group that may be converted to a Y$^1$ group and/or a Y$^2$ group or a Y$^3$ group) in a suitable solvent and in the presence of a catalyst such as platinum(0)-1,3-divinyl-1,1,3,3 tetramethyldisiloxane complex.

Structure (IIIA) may be synthesized by reacting structure (VIA)

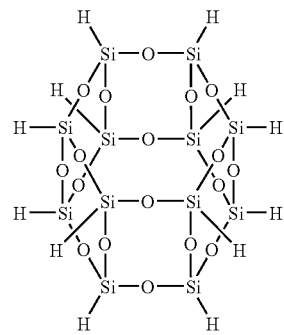
(VIA)

with a substituted alkene or cylcoalkene, the substituent group being a water soluble moiety such as a $Y^1$ group and/or a $Y^2$ group or a $Y^3$ group (or a group that may be converted to a $Y^1$ group and/or a $Y^2$ group or a $Y^3$ group) in a suitable solvent and in the presence of a catalyst such as platinum(0)-1,3-divinyl-1,1,3,3 tetramethyldisiloxane complex.

Structure (IIIB) may be synthesized by reacting structure (VIIB)

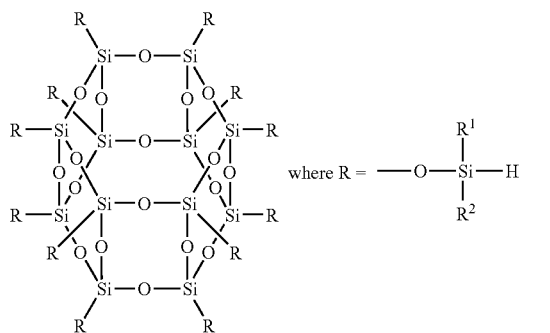

with a substituted alkene or cylcoalkene, the substituent group being a water soluble moiety such as a $Y^1$ group and/or a $Y^2$ group or a $Y^3$ group (or a group that may be converted to a Y group and/or a $Y^2$ group or a $Y^3$ group) in a suitable solvent and in the presence of a catalyst such as platinum(0)-1,3-divinyl-1,1,3,3 tetramethyldisiloxane complex.

When either $R^1$, $R^2$ or both $R^1$ and $R^2$ are —H, the possibility exists of multiple additions of substituted alkene or cylcoalkene groups unless the substituted alkene or cylcoalkene groups are large enough to sterically hinder addition of more than one substituted alkene or cylcoalkene group. The scope of the present invention is intended to cover such multiple additions.

SYNTHESIS EXAMPLES

The silsesquioxane starting materials were purchased from TAL Materials Inc., and Hybrid Plastics. Tetracyclo [4.4.0.1$^{2,5}$.1$^{7,12}$]dodec-3-ene starting materials were obtained from JSR corporation. All the other reagents were purchased from Aldrich Chemical Company. The products were characterized by NMR, IR, DSC, TGA, and GPC. The GPC traces of all the products showed a small shoulder on the high molecular weight side of the main peak. These are thought to be dimers formed during the reaction (J. V. Crivello, and R. Malik, "Synthesis and Photoinitiated Polymerization of Monomers with the Silsesquioxane Core", J. Polym. Sci., Part A: Polymer Chemistry, Vol. 35, 407-425, (1997)). In some cases, the base soluble derivatives were synthesized in the casting solvent and used as is.

Characterization of POSS resin performance was performed using a Quartz Crystal Microbalance (QCM) for dissolution properties, water uptake and film interaction studies. Lithographic behavior was evaluated using an ISI Ultratech 193 nm 0.60 NA microstepper (dry exposure) and a 257 nm interferometer tool for water immersion experiments.

Example 1

Synthesis of a Carboxylic Acid/Ester POSS Derivative

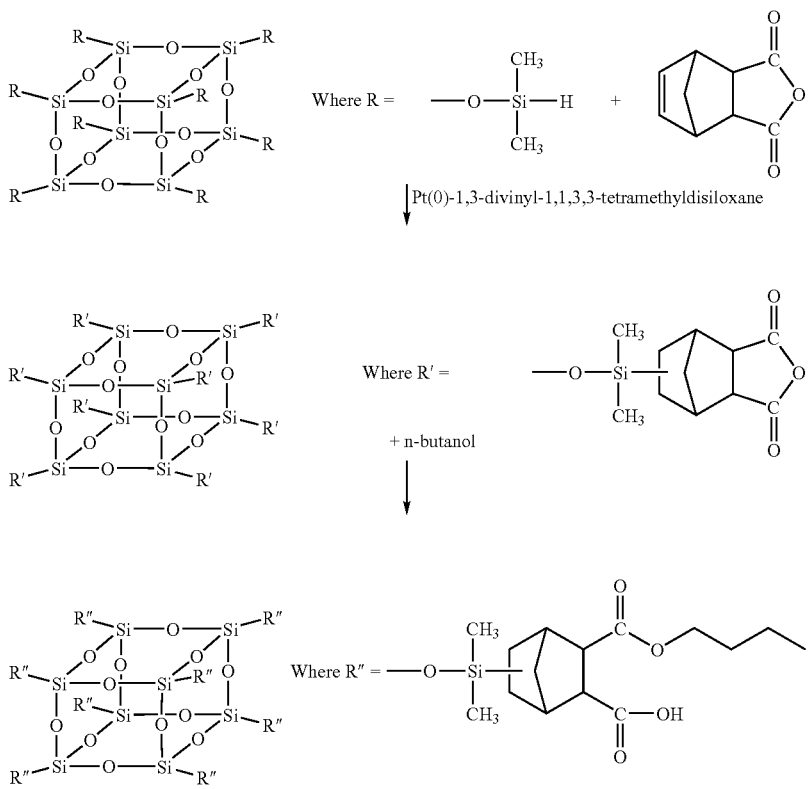

Octakis(dimethylsilyloxy)silsesquioxane ($Q_8M_8^H$) (2.54 grams, 0.0025 mole), cis-5-norbornene-endo-2,3-dicarboxylic anhydride (3.28 grams, 0.020 mole), and tetrahydrofuran (THF) (20 ml) were placed in a round bottom flask equipped with a magnetic stirrer, nitrogen inlet, and a water condensor. Platinum(0)-1,3-divinyl-1,1,3,3-tetramethyldisiloxane complex in xylene (1 ml) was added to this mixture and stirred at room temperature for 1 hour and heated to reflux for 1 more hour. According to the IR spectrum of the reaction product, the reaction was complete. The solvent was removed in a rotary evaporator and the residue was dried under vacuum at room temperature. To the above solid, n-butanol (50 grams), dimethylamino pyridine (DMAP) (50 milligrams) were added and heated to reflux for 1 hour. According to the IR spectrum of the reaction product, the reaction was complete. This solution was stirred with amberlist 15 (washed, 2 grams) for 5 hours and filtered through a 0.2 micron syringe filter.

Example 2

Synthesis of N-Hydoxyimide POSS Derivative

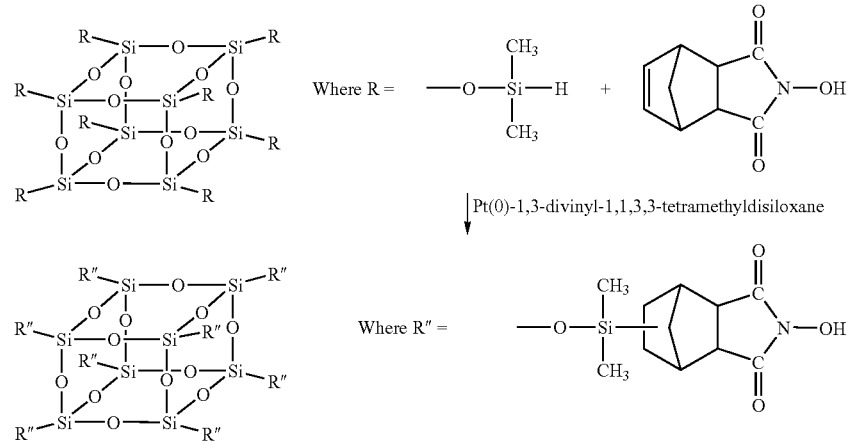

Octakis(dimethylsilyloxy)silsesquioxane ($Q_8M_8^H$) (2.0 grams, 0.002 mole), endo-N-hydroxy-5-norbornene-2,3-dicarboximide (2.96 grams, 0.016 mole)), and tetrahydrofuran (THF) (20 milliliters) were placed in a round bottom flask equipped with a magnetic stirrer, nitrogen inlet, and a water condenser. Platinum(0)-1,3-divinyl-1,1,3,3-tetramethyldisiloxane complex in xylene (1 ml) was added to this mixture and stirred at room temperature for 1 hour and heated to reflux for 1 more hour. According to the IR spectrum of the reaction product, the reaction was complete. The reaction mixture was cooled to room temperature and added dropwise into hexane (400 milliliters). The solid was filtered through a frit funnel, air dried for a 4 hours and then dried under vacuum at 55° C., overnight (yield, 73%).

Example 3

Synthesis of Carboxylic Acid POSS Derivative

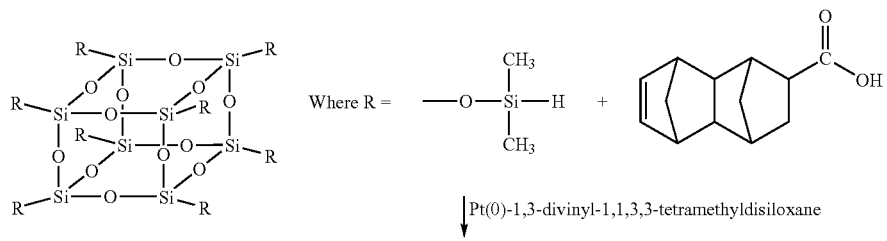

-continued

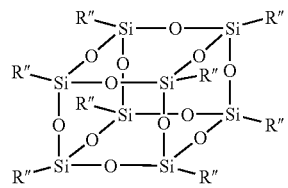

Where R'' =

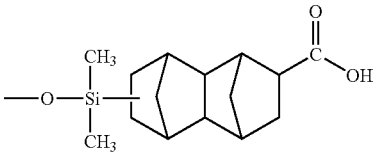

Octakis(dimethylsilyloxy)silsesquioxane ($Q_8M_8^H$) (0.57 grams, 0.00056 mole), tetracyclo[4.4.0.1$^{2,5}$.1$^{7,12}$]dodec-3-ene-5-carboxylic acid (0.92 gram, 0.0045 mole), and n-butanol (13.41 g) were placed in a round bottom flask equipped with a magnetic stirrer, nitrogen inlet, and a water condenser. Platinum(0)-1,3-divinyl-1,1,3,3-tetramethyldisiloxane complex in xylene (0.1 milliliter) was added to this mixture and stirred at room temperature for 24 hours and then at 30° C. for 1 hour. According to the IR spectrum of the reaction product, the reaction was complete. This solution was filtered through a 0.2 micron filter.

EXPERIMENTAL

FIG. 1 is a plot of contrast curves of a photoresist layer without a topcoat layer and a photoresist layer with a topcoat comprising the product of synthesis example 1 of the present invention. A 140 nm thick layer of a commercial 193 nm (exposure wavelength) positive photoresist (Photoresist A) was formed on a first and second 5 inch silicon wafers, each having an anti-reflective coating (ARC). Both wafers were then post apply baked at 110° C. for 90 seconds. A 2% by weight solution of the product described in example 1 in n-butanol was used to form a topcoat over the photoresist layer of the first wafer. The photoresist layer of the second wafer of the photoresist wafers was left uncoated. Both wafers were then baked at 120° C. for 60 seconds. Both wafers were then blanket exposed in air (no mask) to create an array of exposure doses from about 0 mJ/cm² to about 11.5 mJ/cm² at a wavelength of 193 nm. The wafers were then post expose baked at 110° C. for 90 seconds. The wafers were then developed for 60 seconds in a 0.26 N tetramethyl ammonium hydroxide (TMAH) developer. The thickness change of the photoresist layers of both wafers versus exposure dose was measured and are plotted in FIG. 1. Curve 10 was obtained from the first (with a topcoat wafer) and contrast curve 20 was obtained from the second (non-coated) wafer. Contrast curves 10 and 20 are nearly identical indicating the absence of any significant interference of the topcoat with the photoresist exposure/development system.

Figure 2A:
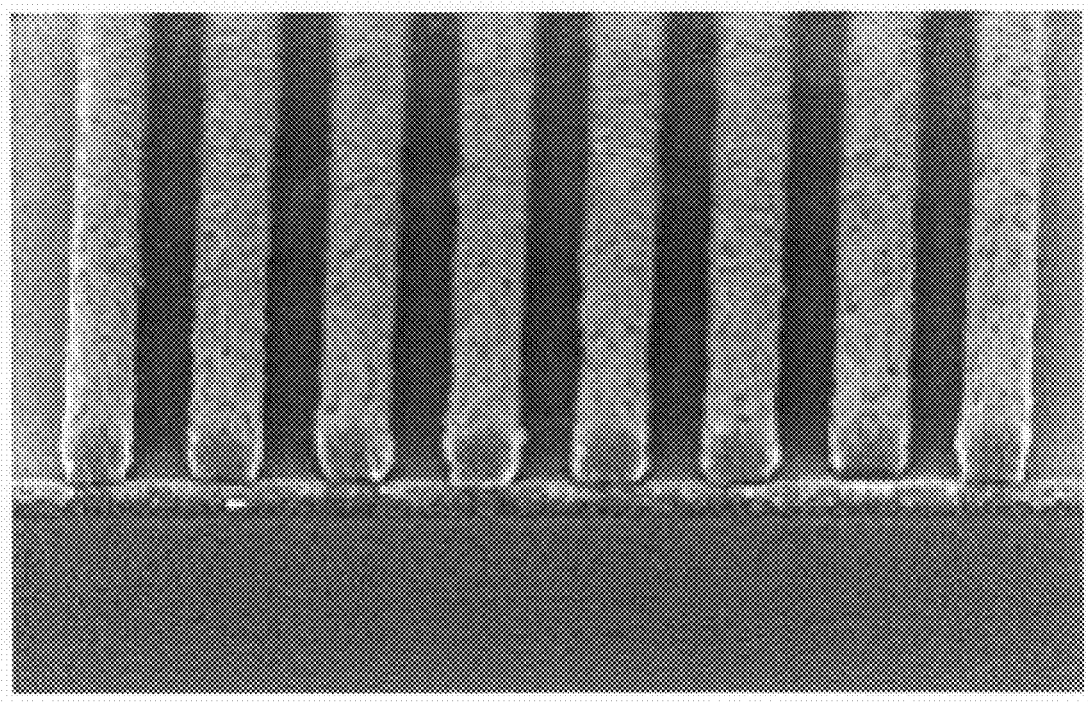
FIG. 2A is a electron micrograph of a photoresist pattern formed in air without a topcoat.

FIG. 2A is an electron micrograph of a photoresist pattern (130 nm lines/spaces) formed in air without a topcoat. A 140 nm thick layer of a commercial 193 nm (exposure wavelength) positive photoresist (Photoresist A) was formed on a first and second 5 inch silicon wafers, each having an anti-reflective coating (ARC). The wafer was post apply baked at 110° C. for 90 seconds. The wafer was then exposed in air through a 1:1 clear to opaque mask pattern at a wavelength of 193 nm and then post expose baked at 110° C. for 90 seconds. The wafer was subsequently developed for 60 seconds in 0.26 N TMAH developer.

Figure 2B:
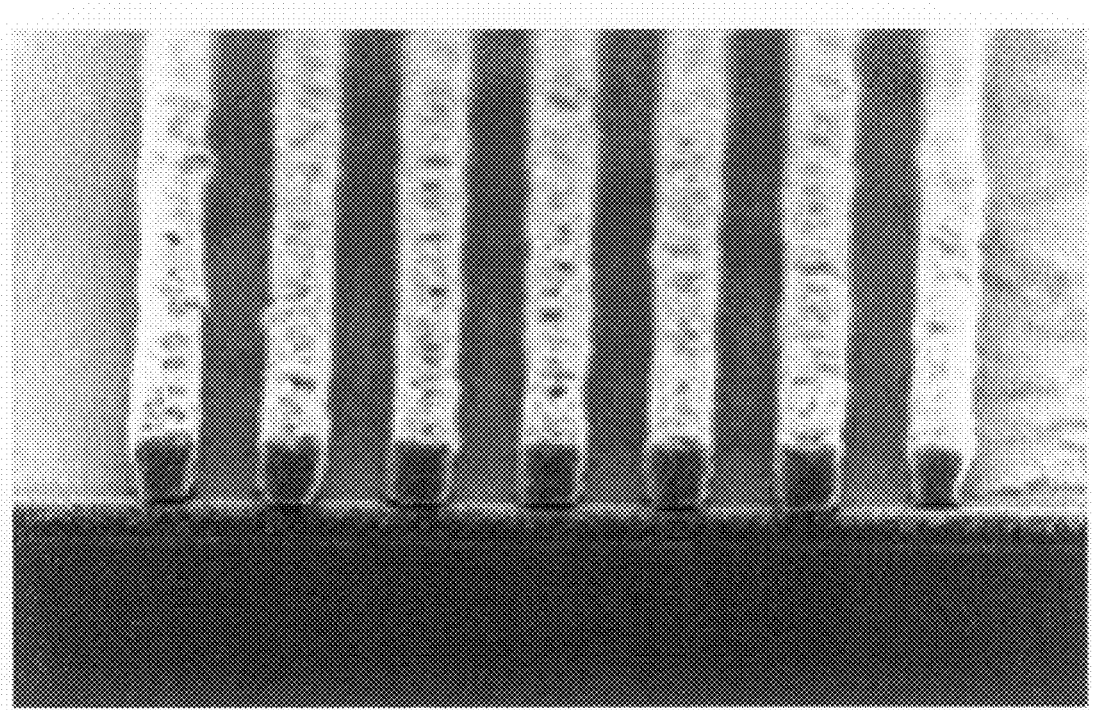
FIG. 2B is a electron micrograph of a photoresist pattern formed in air with a topcoat comprising the product of synthesis example 1 of the present invention.

FIG. 2B is a electron micrograph of a photoresist pattern (130 nm lines/spaces) formed in air with a topcoat comprising the product of synthesis example 1 of the present invention. A 140 nm thick layer of a commercial 193 nm (exposure wavelength) positive photoresist (Photoresist A) was formed on a 5 inch silicon wafer having an anti-reflective coating (ARC). The wafer was post apply baked at 110° C. for 90 seconds. A 2% by weight solution the product of synthesis example 1 in n-butanol was used to form a topcoat over the photoresist layer of the wafer. The wafer was then exposed in air through a 1:1 clear to opaque mask pattern at a wavelength of 193 nm and then post expose baked at 110° C. for 90 seconds. The wafer was subsequently developed for 60 seconds in 0.26 N TMAH developer.

Comparing the electron micrograph of FIG. 2A to the electron micrograph of FIG. 2B illustrates that the photoresist image formed from the photoresist layer that had a topcoat (FIG. 2B) had comparable image to the image formed from the photoresist layer that was did not have a topcoat (FIG. 2A). In fact, improved performance can be observed in that the photoresist layer having a topcoat had a squarer photoresist profile with less rough edges and less thickness loss than the photoresist layer without a topcoat.

Figure 2C:
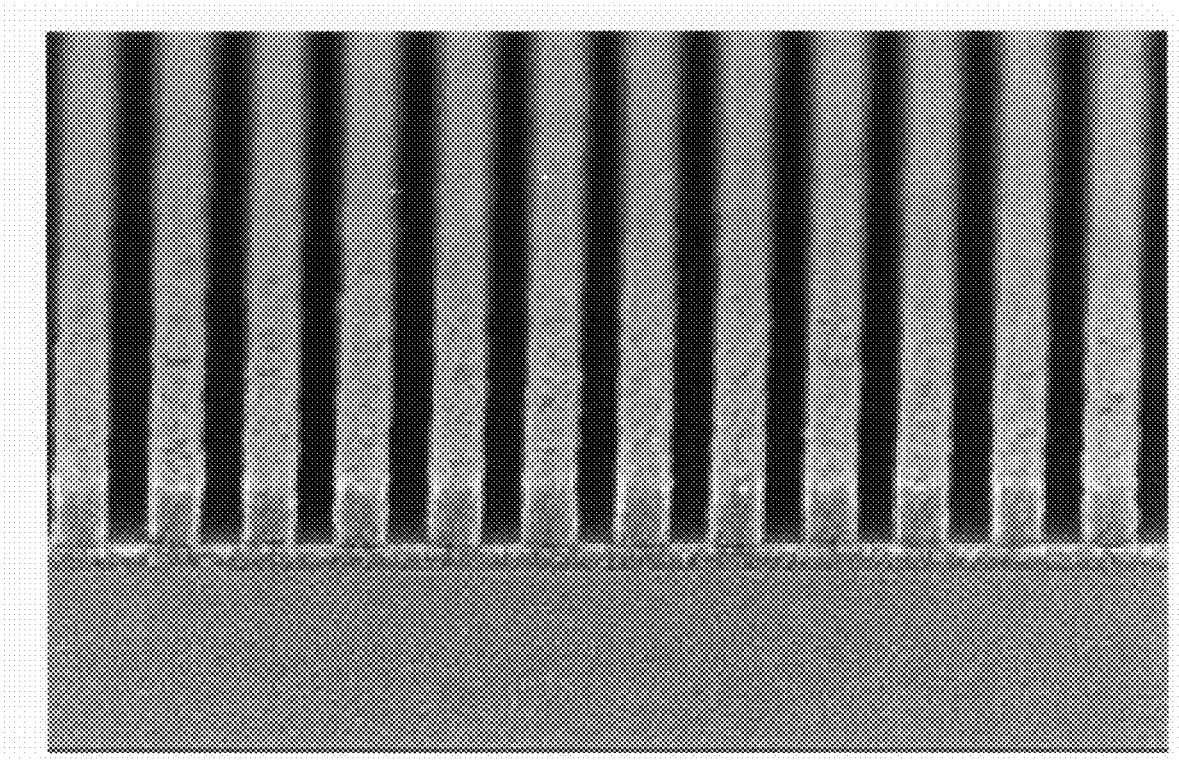
FIG. 2C is a electron micrograph of a photoresist pattern formed under water immersion with a topcoat comprising the product of synthesis example 1 of the present invention.

FIG. 2C is a electron micrograph of a photoresist pattern (90 nm lines/spaces) formed under water immersion with a topcoat comprising the product of synthesis example 1 of the present invention. A 140 nm thick layer of a commercial 193 nm (exposure wavelength) positive photoresist (Photoresist A) was formed on a 5 inch silicon wafer having an ARC. The wafer was post apply baked at 110° C. for 90 seconds (PAB). A 2% by weight solution the product of synthesis example 1 in n-butanol was used to form a topcoat over the photoresist layer of the wafer. The wafer was then exposed under water immersion using 257 nm interference lithography and then post expose baked at 110° C. for 90 seconds. The wafer was subsequently developed for 60 seconds in 0.26 N TMAH developer. The photoresist images of FIG. 3C demonstrate the utility of the product of example 1 as a topcoat material for immersion lithography.

Process Methodology and Tooling

Figure 3A:
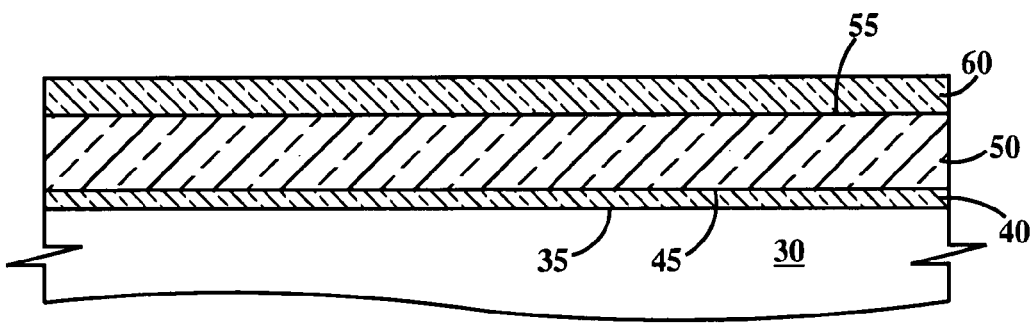
FIG. 3A through 3C are partial cross-sectional views illustrating a semiconductor manufacturing process according to the present invention.
Figure 3B:
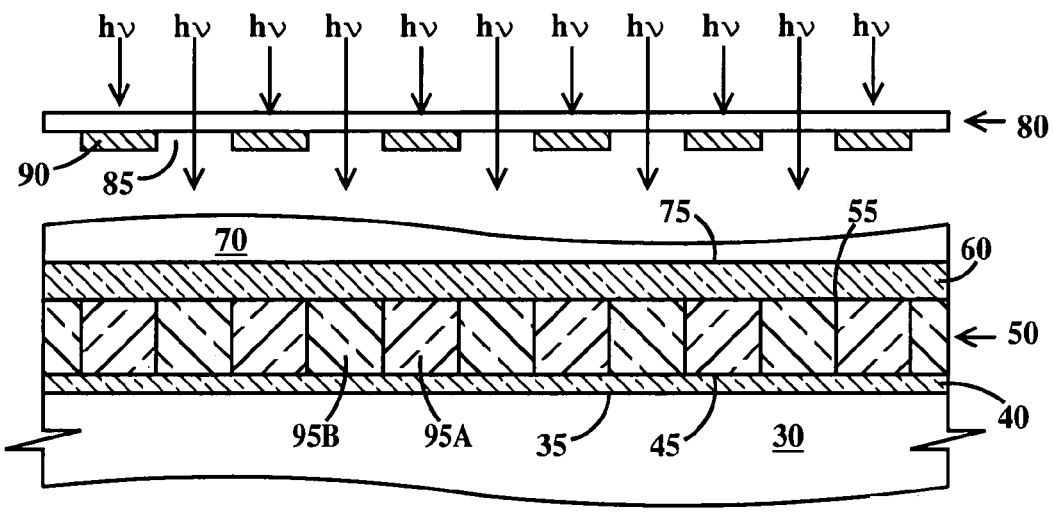
Figure 3C:
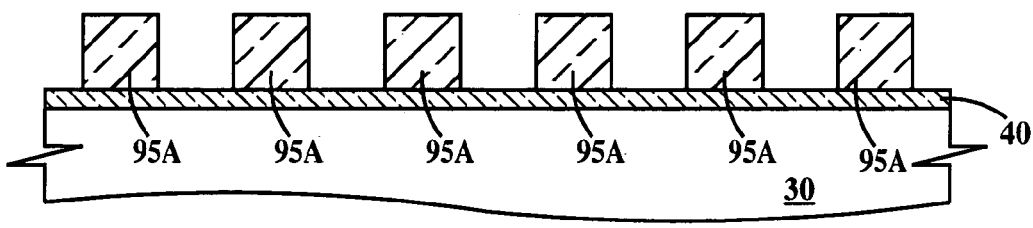

FIG. 3A through 3C are partial cross-sectional views illustrating a semiconductor manufacturing process according to the present invention. In FIG. 3A, a substrate 30 is provided. In one example, substrate 30 is a semiconductor substrate. Examples of semiconductor substrates include but are not limited to bulk (single crystal) silicon wafers and silicon on insulator (SOI) wafers. Formed on a top surface 35 of substrate 30 is an optional ARC 40. In one example, ARC 40 is spin applied and a post ARC apply bake (heated above room temperature to remove most of the ARC solvent) performed. Formed on a top surface 45 of ARC 40 is a photoresist layer 50. In one example, photoresist layer 50 is spin applied and a post photoresist apply bake, also known as a pre-exposures bake or a pre-bake (heated above room temperature to remove most of the photoresist solvent) performed. Next a topcoat 60 is formed on a top surface 55 of photoresist layer 50. In one example, topcoat 60 is spin applied and a post topcoat apply bake (heated above room temperature to remove most of the topcoat solvent) performed. Topcoat 60 comprises a single $T_m^{R3}$ resin, multiple different $T_m^{R3}$ resins, a single $Q_nM_n^{R1,R2,R3}$ resin, multiple different $Q_nM_n^{R1,R2,R3}$ resins or a mixture of one or more different $T_m^{R3}$ resins and one or more different $Q_nM_n^{R1,R2,R3}$ resins as described supra.

Figure 4:
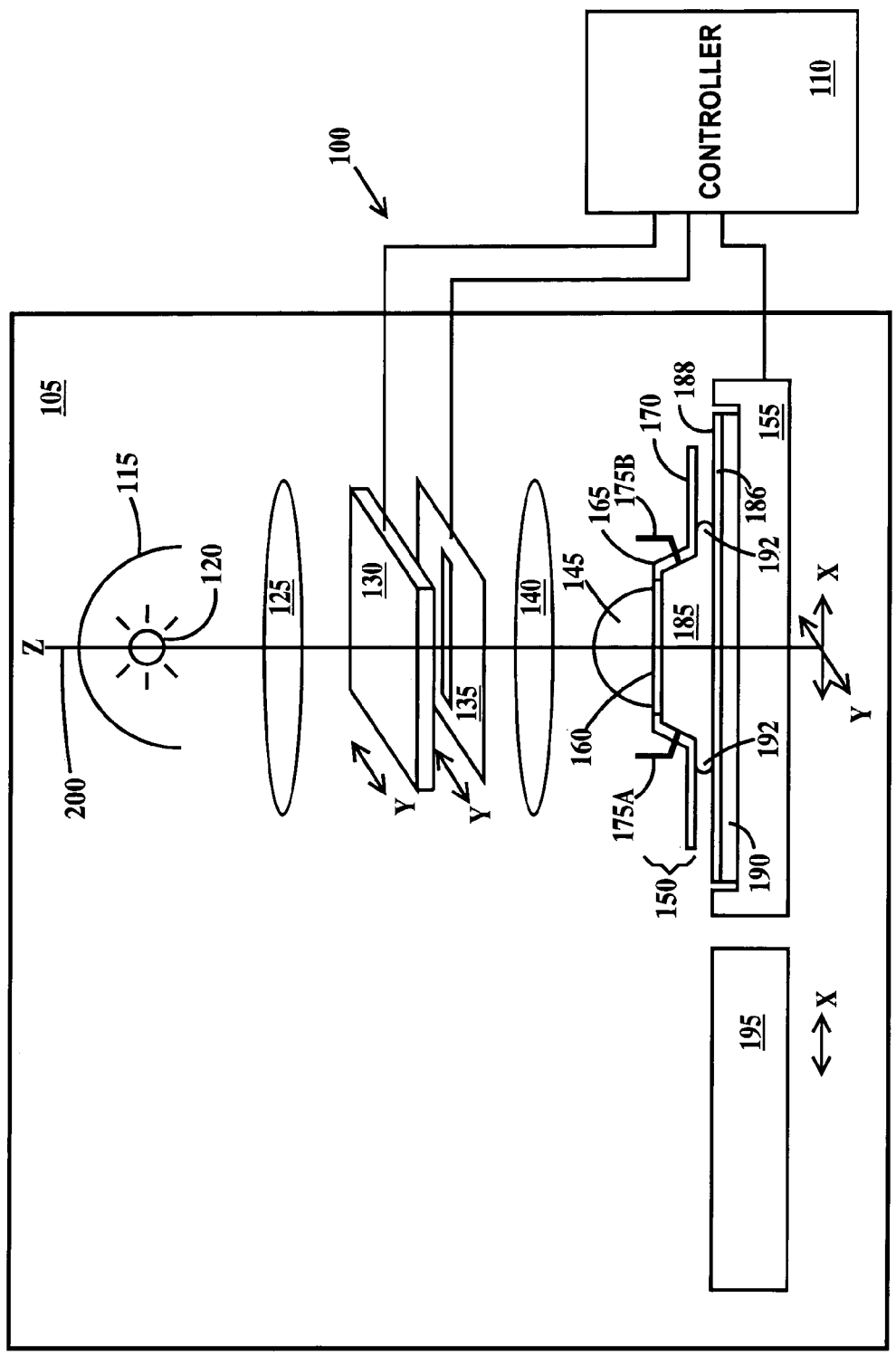
FIG. 4 is a diagram of an exemplary immersion photolithographic system that may be used to process a semiconductor wafer having a topcoat layer according to the present invention.

In FIG. 3B, a layer of immersion fluid 70 is formed over a top surface 75 of topcoat 60 in a immersion photolithography tool (see FIG. 4 and description infra). An example of an immersion fluid is water, with or without additives. Light of a wavelength that photoresist layer 50 is sensitive to is passed through a photomask 80. Photo mask 80 has clear regions 85 that transmit the light and opaque regions 90 that block the light. Exposure of photoresist layer 50 to light through mask 80 forms unexposed regions 95A of photoresist layer 50 and exposed regions 95B of photoresist layer 50. Exposed regions 95B are also known as latent image regions. An optional post exposure bake (heated above room temperature to drive the photoresist chemistry) may be performed.

Although a positive photoresist is shown in FIG. 3B, the present invention works equally well with negative photoresist systems or dual tone photoresist systems. In negative photoresist systems, the photoresist will develop away where it is not exposed to light, so a photomask of polarity opposite to that illustrated in FIG. 3B is required. Dual tone resists can act either negatively or positively depending upon the developer system used.

In FIG. 3C, substrate 30 is removed from the immersion photolithography tool and photoresist layer 50 developed to remove exposed regions 95B (see FIG. 3B) and leave behind unexposed regions 95A. In one example the developer comprises an aqueous solution of a base such as TMAH. Topcoat 60 (see FIG. 3B) is also removed by the developer. Optionally, topcoat layer 60 may be removed separately prior to development of the exposed photoresist layer 50. An optional post development bake, (heated above room temperature to harden the photoresist images) may be performed.

While the exposure of the photoresist layer was described in the context of an immersion photolithography system, the topcoat compositions of the present invention also have utility in conventional (non-immersion) photolithography system as illustrated by the comparison of FIGS. 2A and 2B described supra as a protective coating against environmental contamination from particulates, water vapor, and chemical vapors that could degrade the imaging process or cause imperfections in the photoresist images and ultimately yield or reliability defects in the fabricated product.

FIG. 4 is a diagram of an exemplary immersion photolithographic system that may be used to process a semiconductor wafer having a topcoat layer according to the present invention. In FIG. 4, an immersion lithography system 100 includes a controlled environment chamber 105 and a controller 110. Contained within controlled environment chamber 105 is a focusing mirror 115, a light source 120, a first focusing lens (or set of lenses) 125, a mask 130, an exposure slit 135, a second focusing lens (or set of lenses) 140, a final focusing lens 145, an immersion head 150 and a wafer chuck 155. Immersion head 150 includes a transparent window 160, a central chamber portion 165, a surrounding plate portion 170, an immersion fluid inlet 175A and an immersion fluid outlet 175B. An immersion fluid 185 fills central chamber portion 165 and contacts a photoresist layer 186 on a top surface 188 of a wafer 190, and the photoresist layer 186 includes a topcoat formed of a POSS derivative resin or mixture of POSS derivative resins according to the present invention. Alternatively, wafer 190 may have an ARC formed on top surface 188 and photoresist layer 186 is then be formed on a top surface of the ARC. In one example, immersion fluid 185 includes water. Plate portion 170 is positioned close enough to photoresist layer 186 to form a meniscus 192 under plate portion 170. Window 160 must be transparent to the wavelength of light selected to expose photoresist layer 186.

Focusing mirror 115, light source 120, first focusing lens 125, a mask 130, exposure slit 135, second focusing lens 140, final focusing lens 145, immersion head 150 are all aligned along an optical axis 200 which also defines a Z direction. An X direction is defined as a direction orthogonal to the Z direction and in the plane of the drawing. A Y direction is defined as a direction orthogonal to both the X and Z directions. Wafer chuck 155 may be moved in the X and Y directions under the direction of controller 110 to allow formation of regions of exposed and unexposed photoresist in photoresist layer 186. As an XY-stage moves, new portions of photoresist layer 186 are brought into contact with immersion fluid 185 and previously immersed portions of the photoresist layer are removed from contact with the immersion fluid. Mask 130 and slit 135 may be moved in the Y direction under the control of controller 110 to scan the image (not shown) on mask 130 onto photoresist layer 186. In one example, the image on mask 130 is a 1× to a 10× magnification version of the image to be printed and includes one or multiple integrated circuit chip images.

When exposure is complete, wafer 190 is removed from controlled environment chamber 105 without spilling immersion fluid 185. To this end, controlled environment chamber 105 also includes a cover plate 195 that may be moved to first abut with wafer chuck 155 and then moved with the wafer chuck as the wafer chuck is moved out of position from under immersion head 150, the cover plate replacing the wafer chuck under immersion head 150.

The topcoat compositions of the present invention may be used with other types of immersion lithography tools and example of which is an immersion lithography tool wherein the immersion fluid is dispensed onto the wafer from openings in the lens barrel surrounding the lens.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method of forming an image in a photoresist layer, comprising:
    (a) providing a substrate;
    (b) forming said photoresist layer over said substrate;
    (c) forming a topcoat over said photoresist layer, wherein said topcoat layer comprises a polyhedral oligomeric silsesquioxane based material, said polyhedral oligomeric silsesquioxane based material including an aqueous base soluble functional group;
    (d) exposing said photoresist to radiation through a photomask having opaque and clear regions, said opaque regions blocking said radiation and said clear regions being transparent to said radiation, said radiation changing the chemical composition of regions of said photoresist layer exposed to said radiation forming exposed and unexposed regions in said photoresist layer; and
    (e) removing either said exposed regions of said photoresist layer or said unexposed regions of said layer.

2. The method of claim 1, further including, between (a) and (b), forming an anti-reflective coating over a top surface of said substrate, wherein said photoresist layer is formed on a top surface of said anti-reflective coating.

3. The method of claim 1, further including, between (c) and (d), forming a layer of immersion fluid between said topcoat layer and said photomask.

4. The method of claim 3, wherein said immersion fluid includes water.

5. The method of claim 1, wherein (e) further includes removing said topcoat layer.

6. The method of claim 1, further including, between (c) and (d), removing a casting solvent from said topcoat layer.

7. The method of claim 1, further including, between (c) and (d), heating said topcoat to a temperature above room temperature.

8. The method of claim 1, wherein said topcoat layer does not include materials containing fluorine.

9. The method of claim 1, wherein said topcoat layer comprises:

one or more resins, each resin of said one or more resins selected from the group consisting of $Q_n M_n^{R1,R2,R3}$ resins and $T_m^{R3}$ resins, wherein Q represents $SiO_{4/2}$, $M^{R1,R2,R3}$ represents $R^1, R^2, R^3 SiO_{1/2}$, n is equal to 8, 10 or 12, T represents $R^3 SiO_{3/2}$, and m is equal to 8, 10 or 12;

wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms;

wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; and wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein $Y^1$ and $Y^2$ cannot both be hydrogen, and wherein $Y^3$ is selected from the group consisting of —CONHCO— and —CONOHCO—, each monovalent bond of said $Y^3$ group bonded to different adjacent carbon atoms of said $R^3$; and a casting solvent selected from the group consisting of a linear monohydroxyl alcohol having 4-10 carbon atoms, a branched chain monohydroxyl alcohol having 4-10 carbon atoms, a cyclic monohydroxyl alcohol having 4-10 carbon atom, a linear dihydroxyl alcohol having 4-10 carbon atoms, a branched chain dihydroxyl alcohol having 4-10 carbon atoms, a cyclic dihydroxyl alcohol having 4-10 carbon atoms, and combinations thereof.

10. A method of forming an image in a photoresist layer, comprising:

(a) providing a substrate;

(b) forming said photoresist layer over said substrate;

(c) forming a topcoat over said photoresist layer, wherein said topcoat layer comprises a polyhedral oligomeric silsesquioxane based material, said polyhedral oligomeric silsesquioxane based material includes an aqueous base soluble functional group;

(d) exposing said photoresist to radiation through a photomask having opaque and clear regions, said opaque regions blocking said radiation and said clear regions being transparent to said radiation, said radiation changing the chemical composition of regions of said photoresist layer exposed to said radiation forming exposed and unexposed regions in said photoresist layer; and (e) removing either said exposed regions of said photoresist layer or said unexposed regions of said layer; and wherein said topcoat layer comprises:

a casting solvent selected from the group consisting of a linear monohydroxyl alcohol having 4-10 carbon atoms, a branched chain monohydroxyl alcohol having 4-10 carbon atoms, a cyclic monohydroxyl alcohol having 4-10 carbon atom, a linear dihydroxyl alcohol having 4-10 carbon atoms, a branched chain dihydroxyl alcohol having 4-10 carbon atoms, a cyclic dihydroxyl alcohol having 4-10 carbon atoms, and combinations thereof;

one or more resins, each resin of said one or more resins selected from the group consisting of $Q_n M_n^{R1,R2,R3}$ resins and $T_m^{R3}$ resins, wherein Q represents $SiO_{4/2}$, $M^{R1,R2,R3}$ represents $R^1, R^2, R^3 SiO_{1/2}$, n is equal to 8, 10 or 12, T represents $R^3 SiO_{3/2}$, and m is equal to 8, 10 or 12;

wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms;

wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms;

wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein $Y^1$ and $Y^2$ cannot both be hydrogen, and wherein $Y^3$ is selected from the group consisting of —CONHCO— and —CONOHCO—, each monovalent bond of said $Y^3$ group bonded to different adjacent carbon atoms of said $R^3$; and wherein $R^3$ of at least one resin of said one or more resins is represented by the formula:

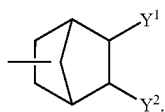

11. The method of claim 10, wherein $Y^1$ is —COO(CH$_2$)$_3$CH$_3$ and $Y^2$ is —COOH.

12. A method of forming an image in a photoresist layer, comprising:
(a) providing a substrate;
(b) forming said photoresist layer over said substrate;
(c) forming a topcoat over said photoresist layer, wherein said topcoat layer comprises a polyhedral oligomeric silsesquioxane based material, said polyhedral oligomeric silsesquioxane based material includes an aqueous base soluble functional group;
(d) exposing said photoresist to radiation through a photomask having opaque and clear regions, said opaque regions blocking said radiation and said clear regions being transparent to said radiation, said radiation changing the chemical composition of regions of said photoresist layer exposed to said radiation forming exposed and unexposed regions in said photoresist layer; and
(e) removing either said exposed regions of said photoresist layer or said unexposed regions of said layer; and
wherein said topcoat layer comprises:
a casting solvent selected from the group consisting of a linear monohydroxyl alcohol having 4-10 carbon atoms, a branched chain monohydroxyl alcohol having 4-10 carbon atoms, a cyclic monohydroxyl alcohol having 4-10 carbon atom, a linear dihydroxyl alcohol having 4-10 carbon atoms, a branched chain dihydroxyl alcohol having 4-10 carbon atoms, a cyclic dihydroxyl alcohol having 4-10 carbon atoms, and combinations thereof;
one or more resins, each resin of said one or more resins selected from the group consisting of $Q_nM_n^{R1,R2,R3}$ resins and $T_m^{R3}$ resins, wherein Q represents SiO$_{4/2}$, $M^{R1,R2,R3}$ represents $R^1,R^2,R^3$ SiO$_{1/2}$, n is equal to 8, 10 or 12, T represents $R^3$ SiO$_{3/2}$, and m is equal to 8, 10 or 12;
wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms;
wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms;
wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein $Y^1$ and $Y^2$ cannot both be hydrogen, and wherein $Y^3$ is selected from the group consisting of —CONHCO— and —CONOHCO—, each monovalent bond of said $Y^3$ group bonded to different adjacent carbon atoms of said $R^3$; and
wherein $R^3$ of at least one resin of said one or more resins is represented by the formula:

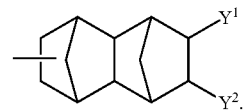

13. The method of claim 12, wherein $Y^1$ is —COOH and $Y^2$ is —H.

14. A method of forming an image in a photoresist layer, comprising:
(a) providing a substrate;
(b) forming said photoresist layer over said substrate;
(c) forming a topcoat over said photoresist layer, wherein said topcoat layer comprises a polyhedral oligomeric silsesquioxane based material, said polyhedral oligomeric silsesquioxane based material includes an aqueous base soluble functional group;
(d) exposing said photoresist to radiation through a photomask having opaque and clear regions, said opaque regions blocking said radiation and said clear regions being transparent to said radiation, said radiation changing the chemical composition of regions of said photoresist layer exposed to said radiation forming exposed and unexposed regions in said photoresist layer; and
(e) removing either said exposed regions of said photoresist layer or said unexposed regions of said layer; and
wherein said topcoat layer comprises:
a casting solvent selected from the group consisting of a linear monohydroxyl alcohol having 4-10 carbon atoms, a branched chain monohydroxyl alcohol having 4-10 carbon atoms, a cyclic monohydroxyl alcohol having 4-10 carbon atom, a linear dihydroxyl alcohol having 4-10 carbon atoms, a branched chain dihydroxyl alcohol having 4-10 carbon atoms, a cyclic dihydroxyl alcohol having 4-10 carbon atoms, and combinations thereof;
one or more resins, each resin of said one or more resins selected from the group consisting of $Q_nM_n^{R1,R2,R3}$ resins and $T_m^{R3}$ resins, wherein Q represents SiO$_{4/2}$, $M^{R1,R2,R3}$ represents $R^1,R^2,R^3$ SiO$_{1/2}$, n is equal to 8, 10 or 12, T represents $R^3$ SiO$_{3/2}$, and m is equal to 8, 10 or 12;
wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms;
wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms;

wherein $R^3$ includes either (a) a substituent $Y^1$ group and a substituent $Y^2$ group or (b) a substituent $Y^3$ group, wherein $Y^1$ and $Y^2$ are each selected from the group consisting of hydrogen, —COOH, —COOR$^1$—, —SO$_2$OH, —C(CF$_3$)$_2$OH, —NHSO$_2$R$^1$, —NHCOR$^1$, wherein $Y^1$ and $Y^2$ cannot both be hydrogen, and wherein $Y^3$ is selected from the group consisting of —CONHCO— and —CONOHCO—, each monovalent bond of said $Y^3$ group bonded to different adjacent carbon atoms of said $R^3$; and wherein $R^3$ of at least one resin of said one or more resins is represented by the formula:

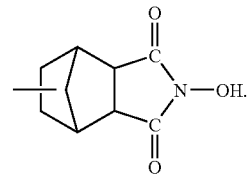

* * * * *